United States Patent
Araki et al.

(10) Patent No.: US 7,459,683 B2
(45) Date of Patent: Dec. 2, 2008

(54) CHARGED PARTICLE BEAM DEVICE WITH DF-STEM IMAGE VALUATION METHOD

(75) Inventors: Mine Araki, Hitachinaka (JP); Shunya Watanabe, Hitachinaka (JP); Chisato Kamiya, Hitachinaka (JP); Mitsugu Sato, Hitachinaka (JP); Atsushi Takane, Mito (JP); Akinari Morikawa, Hitachinaka (JP); Atsushi Miyaki, Hitachinaka (JP); Toru Ishitani, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 236 days.

(21) Appl. No.: 11/582,955

(22) Filed: Oct. 19, 2006

(65) Prior Publication Data

US 2007/0085007 A1  Apr. 19, 2007

(30) Foreign Application Priority Data

Oct. 19, 2005 (JP) ............................. 2005-303815
Feb. 14, 2006 (JP) ............................. 2006-035898

(51) Int. Cl.
*H01J 37/153* (2006.01)
*H01J 37/28* (2006.01)

(52) U.S. Cl. ..................... 250/311; 250/310; 250/306; 250/307; 250/492.2; 250/492.3

(58) Field of Classification Search ................. 250/306, 250/307, 310, 311, 492.2, 492.3
See application file for complete search history.

(56) References Cited

U.S. PATENT DOCUMENTS

| 6,552,340 | B1 * | 4/2003 | Krivanek et al. ............ 250/310 |
| 7,105,816 | B2 * | 9/2006 | Kamiya et al. .............. 250/311 |
| 2004/0183017 | A1 | 9/2004 | Kamiya et al. | |

FOREIGN PATENT DOCUMENTS

| JP | 6-139988 A | 5/1994 |
| JP | 7-169429 A | 7/1995 |
| JP | 2004-214065 A | 7/2004 |
| JP | 2004-253369 A | 9/2004 |

* cited by examiner

*Primary Examiner*—Nikita Wells
(74) *Attorney, Agent, or Firm*—McDermott Will & Emery LLP

(57) ABSTRACT

There is disclosed a charged particle beam device which judges whether or not an image based on a dark-field signal has an appropriate atomic number contrast. Input reference information, a bright-field image or a back-scattered electron image is compared with a dark-field image, and it is judged whether or not a correlation value between them or the dark-field image has a predetermined contrast. According to such a constitution, it is possible to obtain information by which it is judged whether or not the dark-field image has an appropriate atomic number contrast.

13 Claims, 12 Drawing Sheets

REFERENCE IMAGE

DARK - FIELD IMAGE
(ATOMIC NUMBER CONTRAST NG)

DARK - FIELD IMAGE
(ATOMIC NUMBER CONTRAST OK)

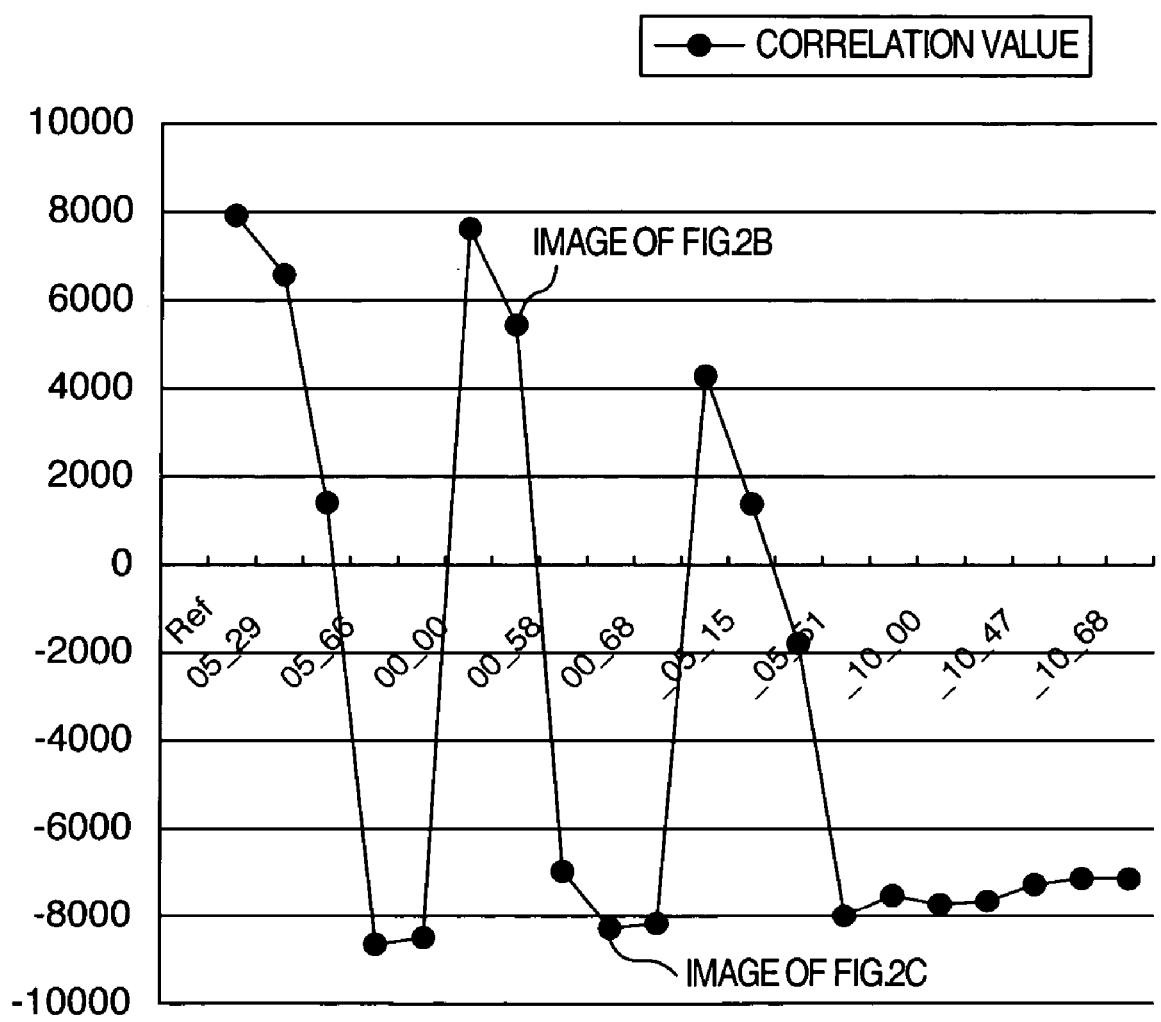

BRIGHT - FIELD IMAGE (REFERENCE IMAGE)

DARK - FIELD IMAGE
DETECTED SCATTERING ANGLE : 50~100mrad
(ATOMIC NUMBER CONTRAST NG)

DARK - FIELD IMAGE
DETECTED SCATTERING ANGLE : 200~300mrad
(ATOMIC NUMBER CONTRAST NG)

DARK - FIELD IMAGE
DETECTED SCATTERING ANGLE : 400~600mrad
(ATOMIC NUMBER CONTRAST OK)

BRIGHT - FIELD IMAGE (REFERENCE IMAGE)

DARK - FIELD IMAGE
DETECTED SCATTERING ANGLE : 200~400mrad
ATOMIC NUMBER CONTRAST NG
LIGHT ELEMENT CONSTITUTING
PORTION CONTRAST OK DARK - FIELD IMAGE
DETECTED SCATTERING ANGLE : 600~800mrad
ATOMIC NUMBER CONTRAST OK
LIGHT ELEMENT CONSTITUTING
PORTION CONTRAST NG

CHARGED PARTICLE BEAM DEVICE WITH DF-STEM IMAGE VALUATION METHOD

BACKGROUND OF THE INVENTION

1. Field of the Invention

The present invention relates to a charged particle beam device, more particularly to a charged particle beam device preferable for detecting signal particles scattered in a sample and transmitted through the sample distinctively from signal particles transmitted through the sample without being scattered to obtain a sample image due to an atomic number difference from the signal particles scattered in the sample and transmitted through the sample.

2. Description of the Related Art

In a charged particle beam device represented by a scanning electron microscope, a charged particle beam thinly converged is scanned on a sample to obtain desired information (e.g., a sample image) from the sample. Much of such charged particle beam devices is used in valuation of a semiconductor device and analysis of defects. Since miniaturizing and multilayer-structuring of the semiconductor device have yearly advanced, a technique of forming the device into a thin film to evaluate the device becomes important in order to analyze defects of the multilayer-structured device.

During observation of a thin film sample, a transmission signal transmitted through the sample is usually used, but in recent years, it has been known that a transmission signal (dark-field signal) scattered in the sample and transmitted through the sample is effective for the analysis of the defects of the device, because the signal intensely reflects an atomic number contrast of the sample.

Moreover, also in a material field, in order to impart functionality, the dark-field signal which intensely reflects the atomic number contrast is also effective for grasping a dispersed state of ultra-fine particles (e.g., a catalyst) carried on fine particles.

In Patent Document 1 (Japanese Patent Application Laid-Open No. 2004-214065 corresponding to U.S. Patent Publication No. US2004/0183017A1), there is proposed a device including a mechanism which changes a position of a detector of charged particles scattered in the sample and transmitted through the sample. In this technique, the detector of the dark-field signal can vertically be moved with respect to an incident electron track to change a signal detection angle of the transmission signal (dark-field signal) scattered in the sample and transmitted through the sample.

The dark-field signal changes in accordance with situations (an atomic number, a density of the sample, a thickness, a crystal orientation, etc.) and observation conditions (an acceleration voltage of an electron beam or the like, the detection angle or the like of the dark-field signal, etc.). Therefore, even when the same sample is observed, the image which intensely reflects the atomic number contrast is not constantly obtained. In the invention disclosed in Patent Document 1, there is not any means for clearly specifying whether or not the image based on the obtained dark-field signal has an appropriate contrast.

SUMMARY OF THE INVENTION

An object of the present invention is to provide a charged particle beam device preferable for judging whether or not an image based on a dark-field signal has an appropriate atomic number contrast, a computer program product for use in the device, and a sample observation method.

The object is realized by comparing input reference information, a bright-field image or a back-scattered electron image with a dark-field image (DF-STEM image: dark-field scanning transmission electron microscope image) to judge whether or not a correlation value between them or the dark-field image has a predetermined contrast.

According to the present invention, it is possible to obtain information by which it is judged whether or not the dark-field image has an appropriate atomic number contrast.

Other objects, features and advantages of the invention will become apparent from the following description of the embodiments of the invention taken in conjunction with the accompanying drawings.

BRIEF DESCRIPTION OF THE DRAWINGS

FIG. 3 is a graph showing a correlation at a time when a reference image is compared with the dark-field image;

DESCRIPTION OF THE INVENTION

An embodiment of the present invention will hereinafter be described with reference to the drawings.

Figure 1:
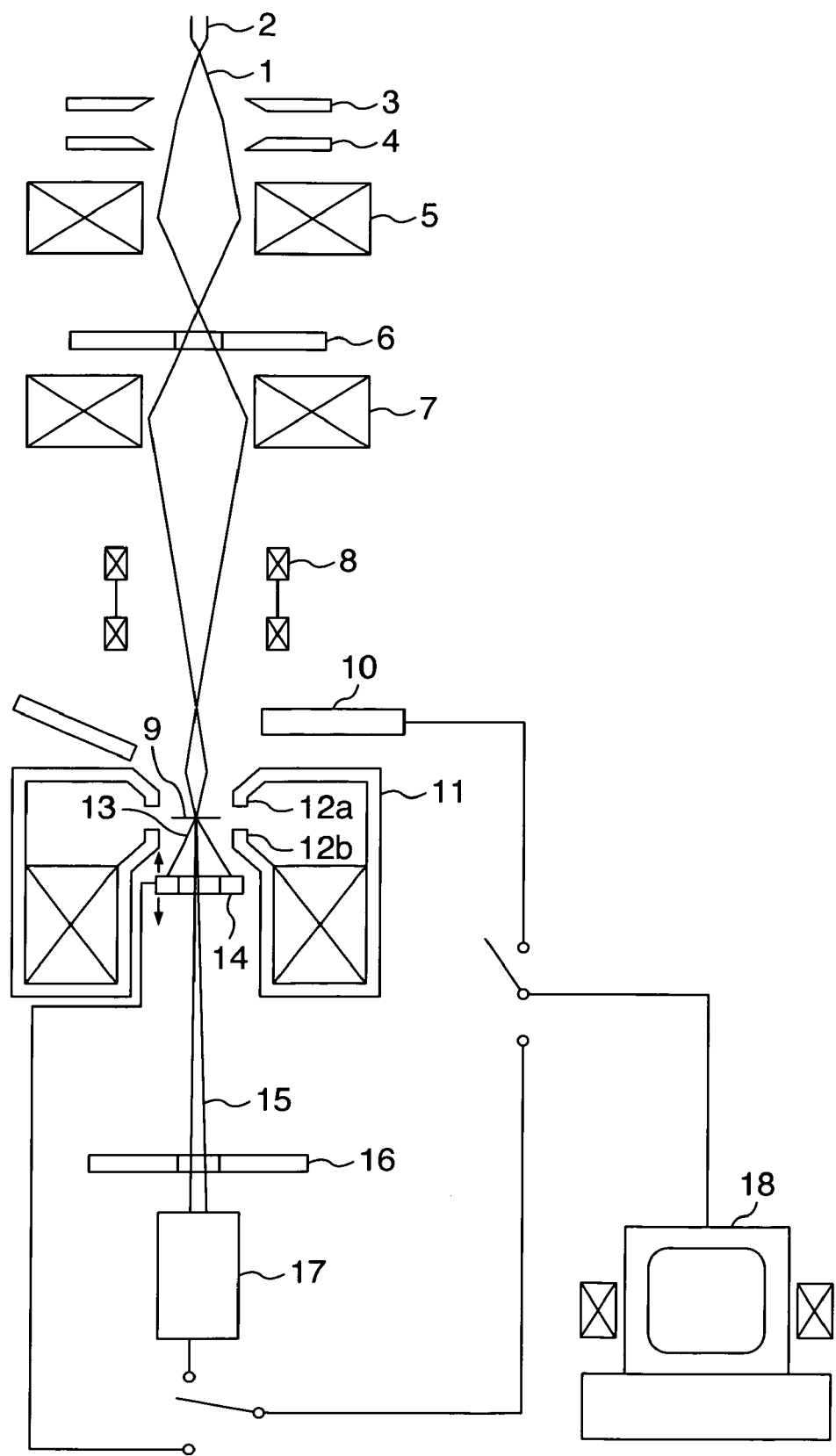
FIG. 1 is a diagram showing one example of a structure of a scanning transmission electron microscope.

In the present embodiment, there are first acquired a dark-field image and a bright-field image as contrast images, a reflection signal image or a composition analysis result. FIG. 1 is a schematic diagram showing a constitution example of a scanning electron microscope capable of observing a scanning transmission electron microscope (STEM) image and the reflection signal image in the present embodiment. In this embodiment, there will be described an electron microscope having a so-called in-lens type objective lens, in which a sample is disposed between magnetic poles of the objective lens, but the present invention is not limited to the in-lens type objective lens, and can be applied to, for example, a snorkel type objective lens.

In FIG. 1, an electron beam 1 emitted from a field-emission electron gun 2 due to an electric field generated by a lead electrode 3 to which a voltage of 3 to 6 kV has been applied is accelerated by an anode 4 (to which a voltage of 0.5 to 30 kV is applied), and then focused by a first focusing lens 5 (C1 lens), and then unnecessary areas of the bam are removed by an objective lens diaphragm 6. The electron beam 1 passed through the objective lens diaphragm 6 is focused into a thinner beam by a second focusing lens 7 (C2 lens) and an objective lens 11. This thinned electron beam 1 is scanned two-dimensionally on a thin film sample 9 having a thickness of about 100 nm and put in the objective lens by a two-step deflecting coil 8.

The secondary (or reflected) electron emitted from the thin film sample 9 is detected by a secondary electron detector 10 installed above the objective lens 11. Composition information such as a characteristic radiation is detected by an X-ray detector. The electron detected by the secondary electron detector 10 is then amplified by an amplifier to form a scanning electron microscope image on a CRT 18 synchronized with the deflecting coil 8.

It is to be noted that although not shown in the device of FIG. 1, a detector which detects a back-scattered electron scattered back from the sample is disposed between the objective lens 11 and the second focusing lens 7. The detector for detecting the back-scattered electron may be a detector disposed along a scattering track of the back-scattered electron to directly detect the electron. Alternatively, a conversion electrode may be disposed along the track of a back-scattered electron image. After the back-scattered electron is converted into a secondary electron by the electrode, the electron may be detected using the secondary electron detector 10.

Furthermore, in the present embodiment, an annular DF detector 14 is disposed in a position close to an objective lens lower magnetic pole 12b, and structured so that a transmission electron (elastic scattering electron) 13 having a scattering angle of 50 mrad or more can be detected. In a case where the sample is irradiated with the electron beam having an acceleration voltage of 200 kV, if the transmission electron having a scattering angle of 50 mrad or more can be detected, a practical dark-field image can be obtained even in a thin film sample such as a semiconductor sample including a heavy element (e.g., Cu, Co or the like). However, when the acceleration voltage is 50 kV or less, detecting of the transmission electron having a scattering angle of at least 100 mrad or more is included in conditions on which a dark-field image having an appropriate atomic number contrast is formed on the thin film sample including the heavy element. Therefore, in the present embodiment, as described above, the dark-field detector 14 is disposed close to the objective lens lower magnetic pole 12b.

Further in the present embodiment, since a bright-field detector 17 is disposed under the dark-field detector 14, a bright-field diaphragm 16 is disposed between the dark-field detector 14 and the bright-field detector 17, and a bright-field signal (non-scattering electron+non-elastic scattering electron) 15 passed through an aperture of the bright-field diaphragm 16 is detected, the bright-field image can be observed.

A transmission amount of the bright-field diaphragm 16 differs with a thickness, a density and an atomic number of the thin film sample. Therefore, when the sample is thick, a bright-field diaphragm having a large pore diameter is used in order to enhance a signal-to-noise (S/N) ratio. When the sample is thin, a bright-field diaphragm having a small pore diameter is used in order to obtain a high contrast.

Figure 5:
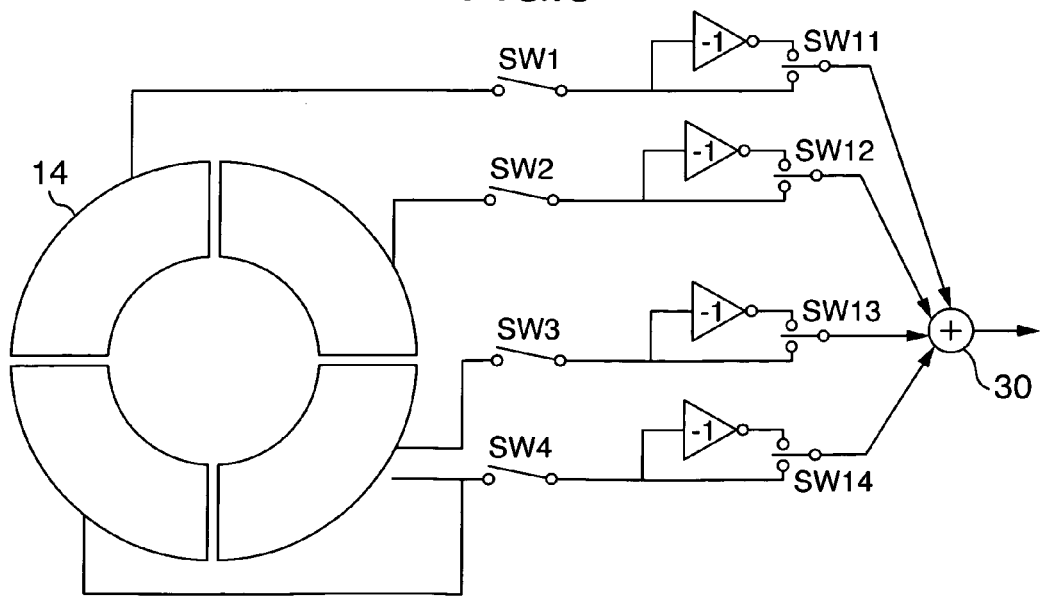
FIG. 5 is a diagram showing one example of a dark-field detector.

As shown in FIG. 5, the dark-field detector 14 may be divided into a plurality of elements in a circumferential direction. When the sample is a crystal article, an intense signal is emitted in an only certain specific direction owing to diffraction of the transmission electron. However, when the dark-field detector 14 is divided, it is possible that the only signal having a specific diffraction angle be non-detected.

There is disposed means capable of simultaneously outputting dark-field signals detected by the divided elements, and selecting or calculating the signal of each detection element. This means makes it possible to non-display information of the only electron scattering and transmitted in a specific direction. When a strong diffraction contrast is suppressed, there is a possibility that the dark-field signal more faithful to atomic number information can be obtained. Here, the dark-field detector 14 described as an example is divided into four elements, but the number of the divided elements may be two or more, and the larger number of the divided elements is preferable. In the present embodiment, after the signals of the divided detection elements are selected with switches SW1 to SW4, settings of additions or subtractions of the detection elements are performed with switches SW11 to SW14. Subsequently, the only signal selected by a signal addition circuit 30 is added. According to this constitution, the signal of the desired detection element can be selected or the signal can be obtained by adding or subtracting the signal of the detection element to observe an STEM image.

The dark-field detector 14 is structured so as to be movable in a direction along an optical axis as shown in FIG. 1. To detect the transmission electron largely scattered by the heavy element (e.g., tungsten, Cu or the like) included in the semiconductor sample, the dark-field detector 14 is moved to the position close to the objective lens lower magnetic pole 12b. To observe a sample (e.g., a biological sample) mainly composed of a light element (to detect a transmission electron having a small scattering angle), the dark-field detector 14 is moved to a position distant from the objective lens magnetic pole. Accordingly, a scattering angle range of the transmission electron detected by the dark-field detector 14 can arbitrarily be changed.

It is to be noted that the acquisition of the dark-field signal is not limited to the above embodiment. A signal detection angle does not have to be necessarily controlled. As in a general STEM device, the detection angle of the dark-field signal detected by a control lens disposed under the objective lens may be controlled. As in Japanese Patent Application Laid-Open No. 7-169429, a diaphragm for the bright-field image and a diaphragm for the dark-field image may be held by a common diaphragm base, and this diaphragm position may be switched to thereby switch and acquire the dark-field signal and the bright-field signal with one detector.

At this time, when a size of the diaphragm is changed, the detection angle of the dark-field signal to be detected can be controlled. Moreover, as described in Japanese Patent Application Laid-Open No. 6-139988, multistage diaphragms each having a mechanism similar to that of a camera shutter may be disposed to acquire an image whose scattering angle range has been selected. Furthermore, in signal detecting means for once allowing the dark-field signal to collide with a conversion member and detecting a secondary signal generated by the conversion member, a shape of the signal conversion member is changed, or a potential in the vicinity of the member is controlled, whereby the detection angle of the dark-field signal can be controlled.

Moreover, the acquisition of the bright-field signal is not limited to the above embodiment, and the signal detection angle does not have to be necessarily controlled. For example, the bright-field signal detector does not necessarily have to be installed under the dark-field signal detector as long as the position of the bright-field signal detector is under the sample as viewed from an electron beam incidence direction. To control the signal detection angle, the diaphragm may be disposed above the detector in the center of the optical axis. Alternatively, multistage diaphragms having different pore diameters may switchably be arranged so that an arbitrary hole is disposed in the center of the optical axis.

It is to be noted that in the present embodiment, a control unit (not shown) is disposed to control the scanning transmission electron microscope of FIG. 1. The control unit controls each optical element constituting the scanning transmission electron microscope, and is also provided with a frame memory for registering an image formed based on the electron detected by the detector. This frame memory is constituted so as to be capable of registering images such as a secondary electron image, the back-scattered electron image, the dark-field image and the bright-field image. Furthermore, in the control unit, there is incorporated a program for comparing the images registered in the frame memory with each other. The program may be used in not only the comparison of the images but also control of each optical element of the scanning transmission electron microscope. Furthermore, it is programmed that, for example, normalization correlation processing to confirm a correlation between two images be performed in order to compare the images with each other.

In a normalization correlation process, with respect to each pixel of two images in the whole surface or in a predetermined region, a degree of agreement between the two images is obtained. From a position of one image where a correlation value is maximized, a position corresponding to the other image is obtained. Assuming that a pixel value in a point (i, j) of one image is Mij, a pixel value of a point (X+i, Y+j) corresponding to the other image is Pij, and the number of the constituting pixels in the whole one image or in the predetermined region is N, a normalization correlation coefficient r (X, Y) of both the images in a position (X, Y) of one image on the other image is obtained by equation (1).

$$r(X, Y) = \frac{\left[N \sum_{ij=0}^{n} PijMij - \left(\sum_{ij=0}^{n} Pij\right)\left(\sum_{ij=0}^{n} Mij\right)\right]}{\sqrt{\left[N \sum_{ij=0}^{n} P^2ij - \left(\sum_{ij=0}^{n} Pij\right)\right]^2} \sqrt{\left[N \sum_{ij=0}^{n} M^2ij - \left(\sum_{ij=0}^{n} Mij\right)\right]^2}} \quad \text{(Equation 1)}$$

The normalization correlation is a technique to calculate a difference between the pixel values of two images, and is a technique preferable for confirming a difference between the images. It is to be noted that in the following description, as a technique of comparing two images, an example using the above normalization correlation process will be described, but the present invention is not limited to this example, and any image processing process capable of digitalizing differences among a plurality of images is applicable as an image comparing process of the present embodiment.

It is to be noted that in the present embodiment, it has been described that the control unit is integrated with the electron microscope or disposed in the microscope. Needless to say, the present invention is not limited to this embodiment. A control unit disposed separately from an electron microscope lens barrel may perform the following processing. In this case, there are required a transmission medium which transmits to the control unit a detection signal detected by the detector or transmits the signal from the control unit to a lens, a deflector or the like of the scanning electron microscope; and an input/output terminal with respect to which the signal transmitted via the transmission medium is input or output.

Moreover, a program to perform the following processing may be registered in a storage medium, and a control unit having an image memory and configured to supply a signal necessary for the scanning electron microscope may execute the program. The following description also relates to a program applicable to a charged particle beam device including an image processor, or a program product.

There will be described hereinafter a technique of comparing the dark-field signal with another signal (the back-scattered electron image, the bright-field image and reference information) to thereby judge whether or not the dark-field image has an appropriate contrast.

Figure 4:
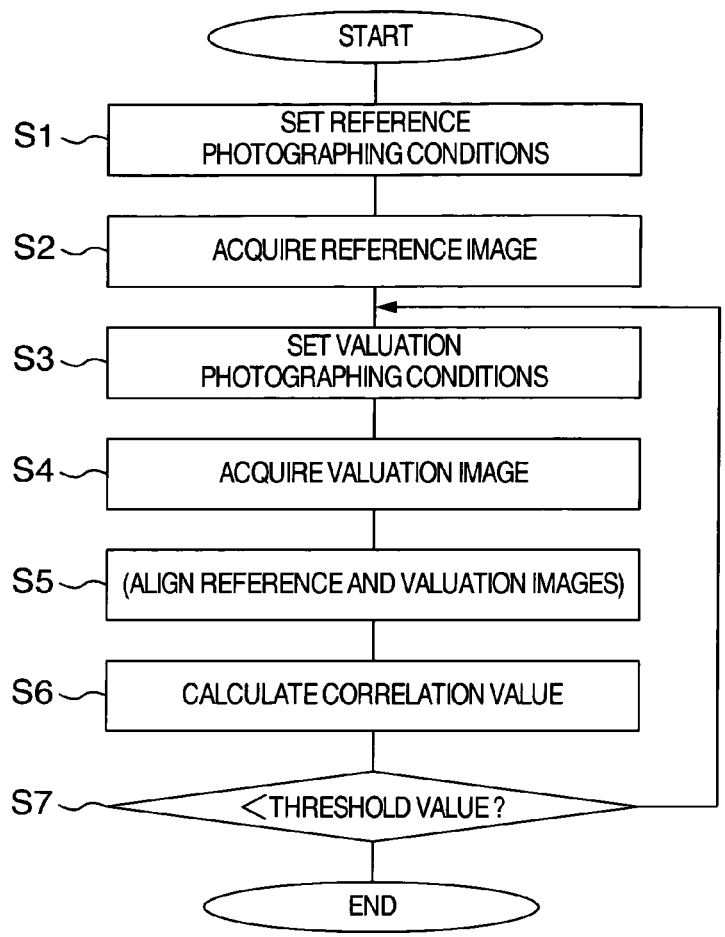
FIG. 4 is a flow chart for judging whether or not the dark-field image is appropriate.

FIG. 4 is a flow chart for judging whether or not the dark-field image is appropriate. First, photographing conditions of the reference image are set (step 1). In the step 1, there are set device conditions for acquiring the bright-field image, the back-scattered electron image or another reference image as an object of comparison with the dark-field image. For example, optical conditions (the acceleration voltage of the electron beam, a observation magnification, a lens focus, etc.) of the device are set. Furthermore, as the object of the comparison with the dark-field image, there is selected one of the bright-field image, the back-scattered electron image and the other reference image.

Next, the bright-field image, the back-scattered electron image or the other reference image is acquired (step 2). Furthermore, there are set photographing conditions of the dark-field image which is an image for valuation (step 3). Examples of the photographing conditions include the detection angle of the dark-field signal. Moreover, the dark-field image is acquired (step 4).

Next, the dark-field image and the selected image (e.g., the bright-field image) are aligned (step 5), and the correlation between the images is calculated (step 6). A portion (background) where there is not any sample becomes dark, and a portion where the beam is scattered by the sample becomes bright in the dark-field image. In the bright-field image, the portion where there is not any sample is brightened. Since contrasts of both the images are reversed, the correlation between the images is low.

In a case where such conditions are used, when the correlation value between both the images is below a certain threshold value, it can be judged that the dark-field image is appropriately formed. This is because the high correlation between the images means that the above-described contrast reverse phenomenon does not sufficiently occur, and it can be judged that the dark-field image is not appropriately formed.

Figure 2A:
FIGS. 2A-2C are diagrams showing examples of a bright-field image and a dark-field image acquired by the scanning transmission electron microscope.
Figure 2B:
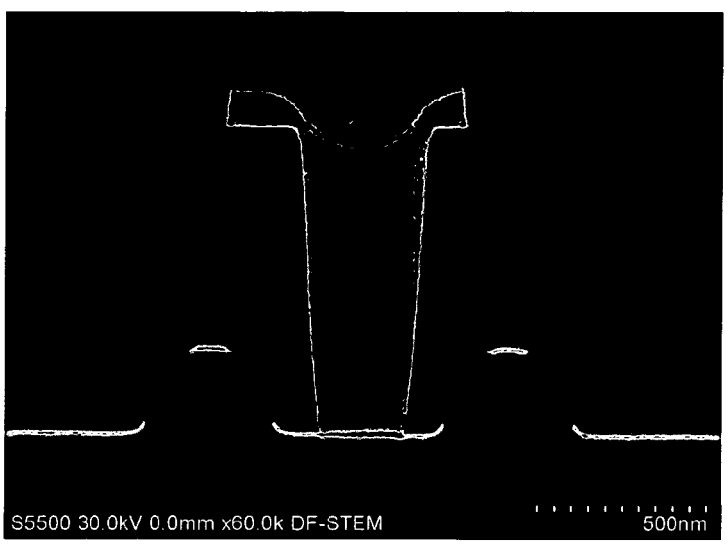
Figure 2C:
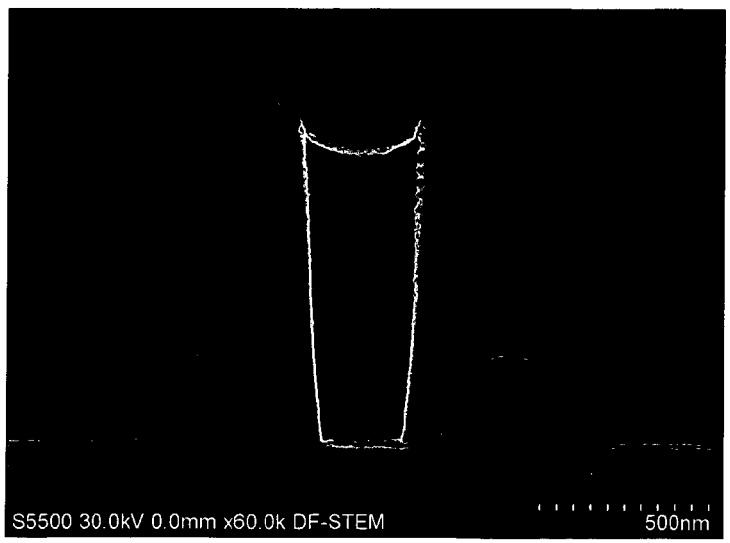

FIGS. 2A to 2C show photographing examples of the bright-field image and the dark-field image by the STEM. FIG. 2A shows the bright-field image acquired as a reference image. FIGS. 2B and 2C show the dark-field images, but FIG. 2B shows an image whose atomic number contrast is insufficient, and FIG. 2C shows an image whose atomic number contrast is appropriate. As also seen from these images, when the dark-field image of FIG. 2B is compared with the bright-field image of FIG. 2A, there is not any clear difference between the contrasts in, for example, the centers of the images. On the other hand, in FIG. 2C, there is a clear contrast difference.

This relation is shown in a graph of FIG. 3. As compared with FIG. 2B, it is apparently seen that the correlation value of FIG. 2C is small.

In consequence, for the above reason, when the correlation value is above the threshold value, any appropriate dark-field image is not acquired. Therefore, the photographing conditions are set again, and a valuation image is acquired (step 7).

It is to be noted that as conditions for acquiring the valuation image, a range of the signal detection angle (values of an inner angle and an outer angle) is set. Alternatively, there is set the signal detection angle on an inner side (narrow-angle side) on which a signal detection amount is larger in the dark-field signal detector, or an operation related to the controlling of the signal detection angle is performed to thereby realize the valuation image. As the operation related to the controlling of the signal detection angle, in the present embodiment, for example, the dark-field signal detector is vertically moved along the optical axis. Examples of such an operation include an operation of moving a position of the thin film sample vertically along the optical axis to change a magnetic intensity of the objective lens during the observation of the sample, but the present invention is not limited to these examples. Moreover, factors to change an image contrast of another valuation image may be set as the conditions for acquiring the valuation image. Examples of the factors include the acceleration voltage of the electron beam 1. When the acceleration voltage is raised, an interaction between the electron beam and the sample is reduced. Even when the signal detection angle is equal, it is possible to obtain the image contrast further derived from the atomic number difference.

Figure 6:
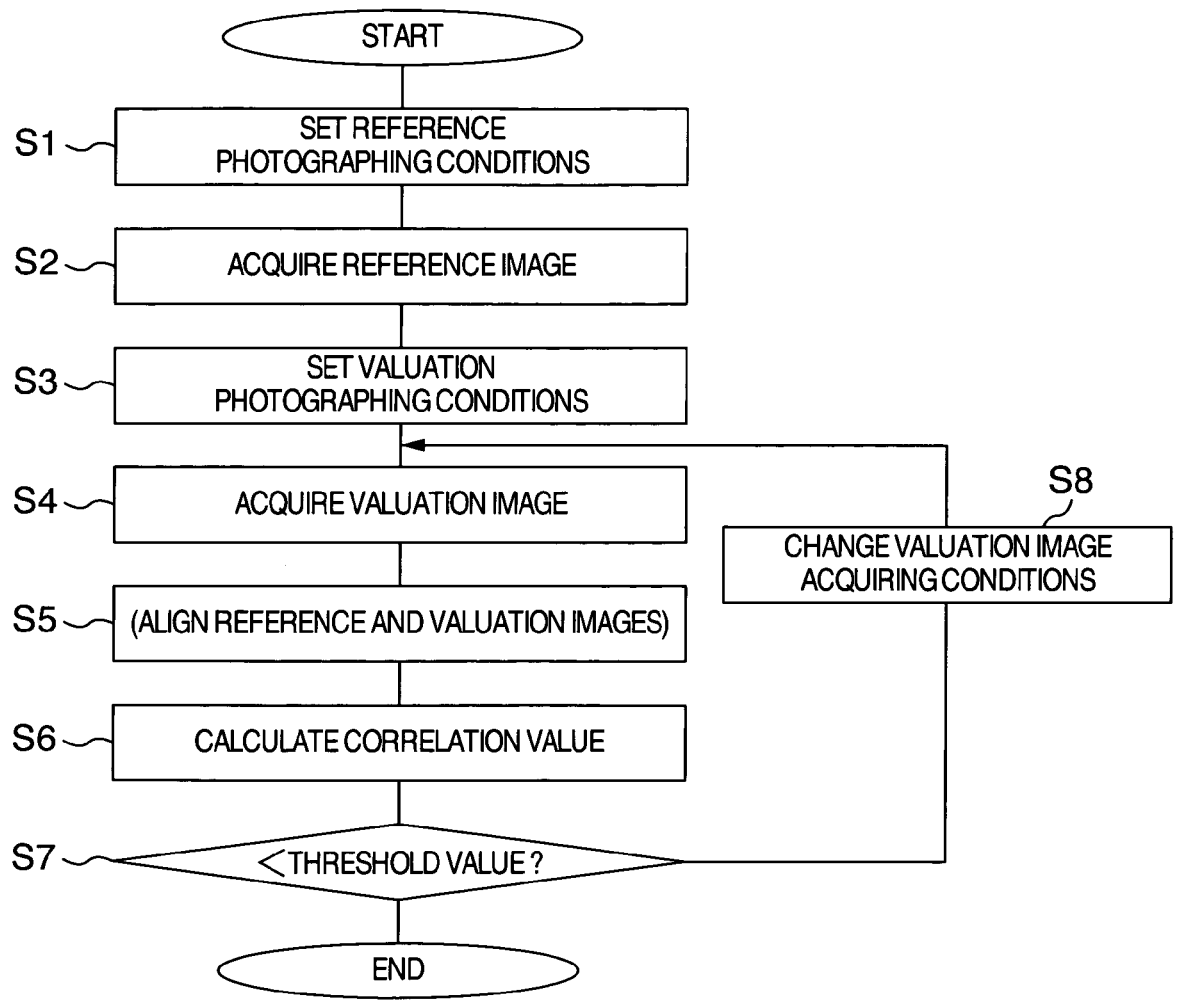
FIG. 6 is a flow chart showing an example in which measurement is repeated until a targeted image contrast is obtained.

FIG. 6 is a flow chart in a case where measurement is repeated while changing the conditions for acquiring the valuation image until the valuation image having a targeted image contrast is obtained. First, reference image acquiring conditions are set (step 1), and a reference image is acquired (step 2). Subsequently, valuation image acquiring conditions are set (step 3), but at this time, there is set beforehand, for example, a change step in accordance with an initial value of a dark-field signal detection angle. Subsequently, a dark-field image is acquired (step 4), the images are aligned (step 5), and a correlation value is calculated (step 6). Here, when the correlation value is above a threshold value, a set value is changed at a ratio (degree) determined in the step 3 (step 8), and then the valuation image is acquired. This is repeated until the correlation value drops below the threshold value. Here, the signal detection angle set in the step 3 has been described on an presumption that setting is changed from the narrow-angle side to a wide-angle side, but the image may be acquired while changing the setting from the wide-angle side to the narrow-angle side. In this case, the measurement may be repeated until the correlation value rises above the threshold value, an image (the correlation value is below the threshold value) acquired on the conditions set immediately before the correlation value rises above the threshold value may be regarded as a final target image. It is to be noted that although not shown, after repeatedly acquiring the valuation image on a plurality of set valuation image acquiring conditions (e.g., signal detection angle change conditions), each image is aligned with the reference image, the correlation value is calculated, and an image having the smallest correlation value may be selected as a targeted image. Alternatively, as the final target image, an image having the largest correlation value may be selected from the images having the correlation values which are below the threshold value. Since a positive correlation is recognized between the correlation value and the S/N of the dark-field signal image in many cases, an image having a targeted image contrast and a high S/N ratio can be selected as a final image in this case.

Figure 7:
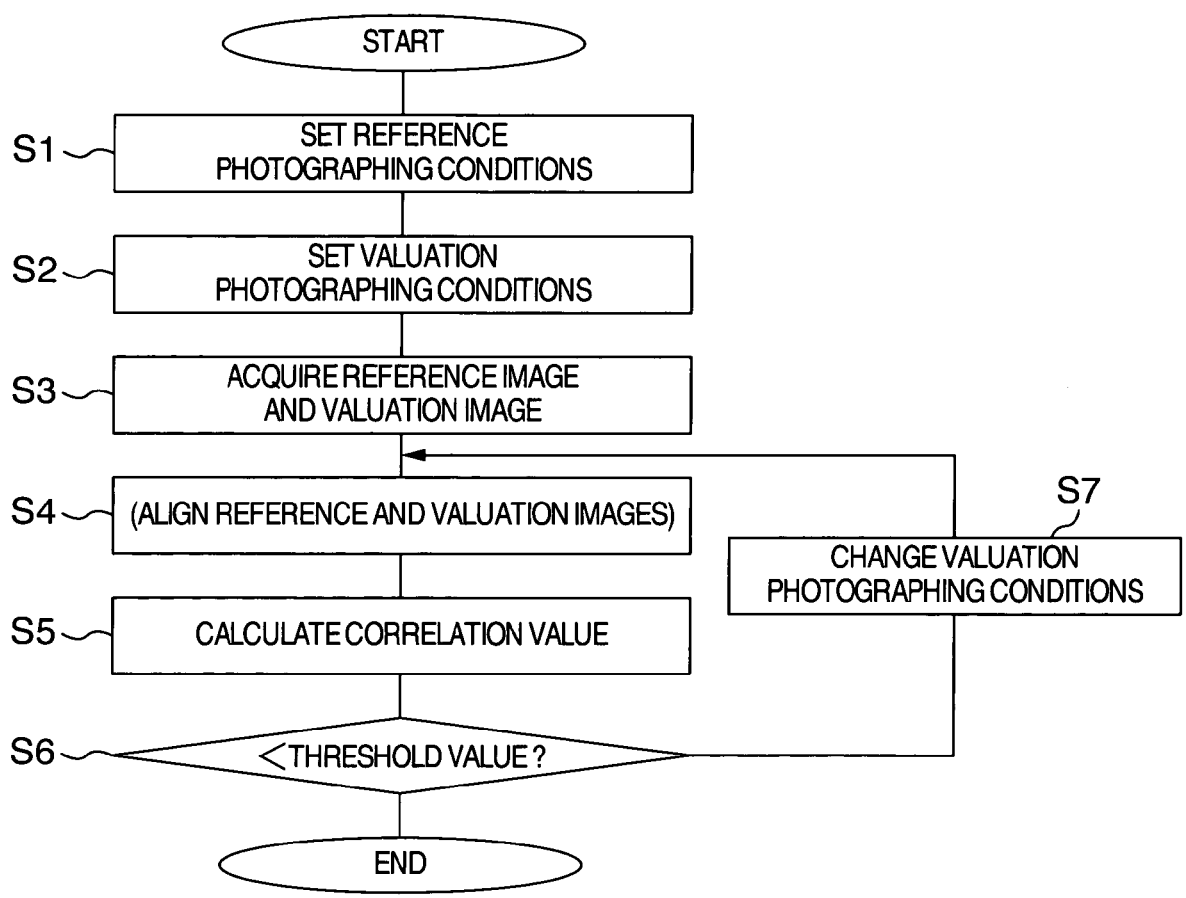
FIG. 7 is a diagram showing a processing flow in a case where signals of the reference image and a valuation image are simultaneously detected.

Here, when the dark-field signal is compared with the bright-field signal or the reflection signal, it is preferable to acquire the signal in the same position without any field deviation. Therefore, there may be disposed means for simultaneously detecting heterogeneous signals and storing images independently of one another. FIG. 7 shows an operation flow in a case where the signals of the reference image and the valuation image are simultaneously detected. First, after reference image photographing conditions are set, valuation image photographing conditions are set (steps 1 and 2). Next, the signals of the reference image and the valuation image are simultaneously acquired (step 3: with the proviso that the images are individually and temporarily stored). The valuation and reference images are aligned (step 4), and a correlation value is calculated (step 5). Subsequently, when the correlation value is above a threshold value, a set value is changed on the conditions determined in the step 2 (step 7). Subsequently, the valuation and reference images are acquired. This is repeated until the correlation value drops below the threshold value. It is to be noted that although not shown, after repeatedly acquiring the valuation image on a plurality of set valuation image acquiring conditions, each image is aligned with the reference image, the correlation value is calculated, and an image having the smallest correlation value or an image having the largest correlation value below the threshold value may be selected as the target image. At this time, as the reference image, a reference image obtained simultaneously with the valuation image may be used, but one of a plurality of repeatedly acquired reference images may be designated, and all the valuation images may be compared with the designated reference image. When there is a slight field deviation, the deviation may be corrected by an image correlation process such as the above-described normalization correlation. In a case where the field deviation correction by the image correlation process is not well adaptive, after an operator designates characteristic points of images, positions may be corrected so that the characteristic points agree with each other.

To calculate the correlation value after the positional correction, the correlation values of the reference image (bright-field image) and the valuation image (dark-field image) may be compared in the whole image regions. In the bright-field image, even when a composition is the same, there exist regions having different contrasts owing to a diffraction contrast in a specific position. Such an image region is omitted beforehand. Alternatively, it may be devised that the correlation value be obtained by an averaged contrast in an only designated regional portion.

Furthermore, as the reference image, instead of the actually photographed bright-field image or back-scattered electron image, a prepared pseudo image or the same type of image photographed in the past may be input in the above control unit by use of an input unit (not shown) to compare the image with the dark-field image.

For example, after a region is designated from a plurality of regions having different compositions in the same field of the bright-field image or the dark-field image (the image does not have to necessarily have the atomic number contrast) acquired as the reference image, an average atomic number of each region is input, or the regions are designated in order of the average atomic number, and it may be judged by comparison whether or not the image contrast in the same region of the valuation image is brightened in order of the average atomic number (in the heavy element).

Embodiment 2

There will be described hereinafter a device capable of determining observation conditions based on a scattering angle region predicting simulation of a transmission electron with reference to the drawings.

In Embodiment 1, it has mainly been described that a dark-field image for valuation is acquired beforehand and compared with a bright-field image to judge whether or not an image based on the resultant dark-field signal has an appropriate contrast. To acquire this dark-field image for the valuation, it is necessary to grasp beforehand a knowledge concerning a transmission electron image or approximately a principle of a device optical system.

Moreover, when conditions for acquiring the dark-field image for the valuation are different from ideal conditions, the number of images until optimum observing conditions are reached is large. Therefore, it is necessary to efficiently reach the optimum observing conditions in consideration of a risk of a beam damage or contamination on a sample.

Moreover, much time is sometimes required for acquiring the valuation image and changing image acquiring conditions.

There will be described hereinafter a charged particle beam device preferable for deriving optimum observing conditions so that an image based on a dark-field signal has an appropriate atomic number contrast, a computer program for use in the device, and a sample observation method.

In the present embodiment, there will particularly be described a proposal of an observation technique using the scattering angle region predicting simulation of the transmission electron, in which a behavior of the electron transmitted through a sample is predicted, and optimum optical conditions are derived from a predicted value.

First, there will be determined a calculation model to simulate a scattering angle region in a case where the electron passes through the sample.

Figure 8:
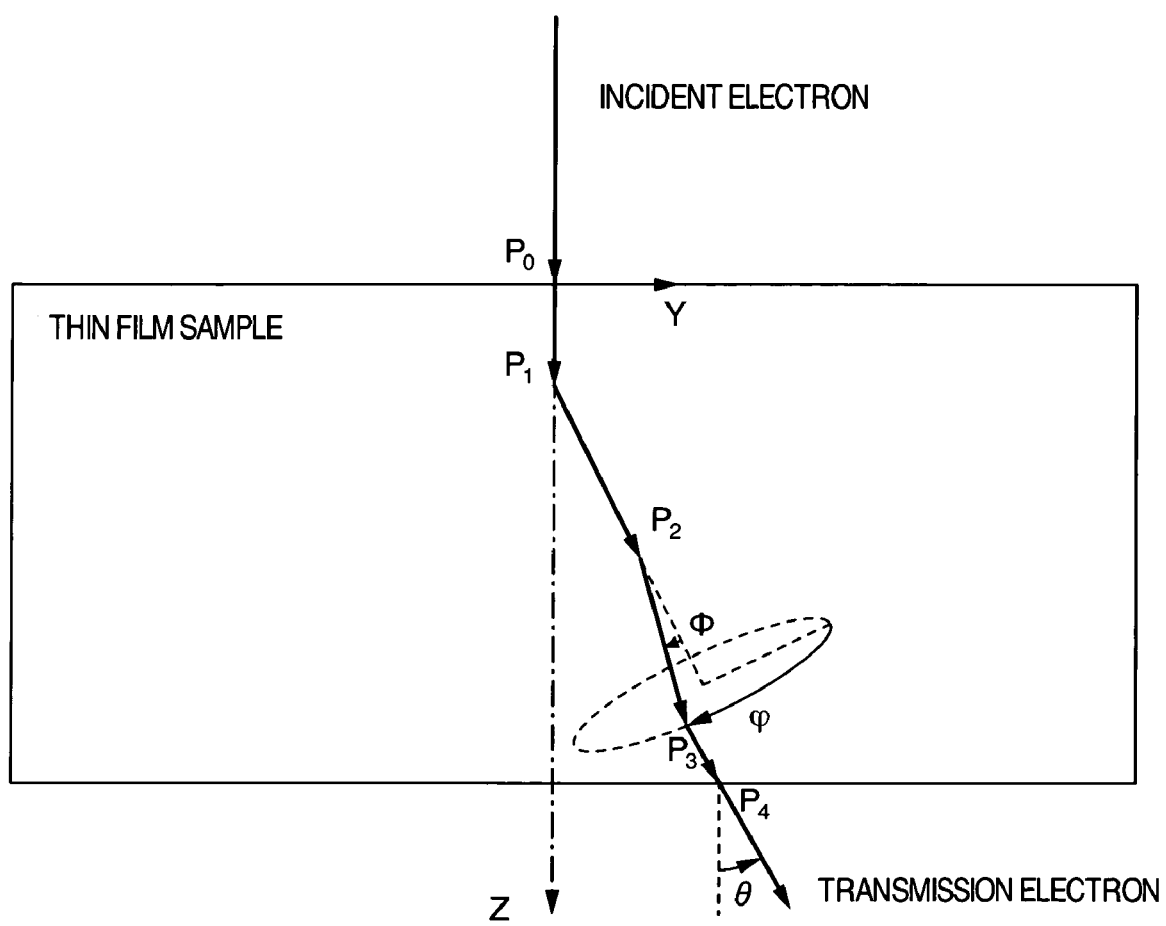
FIG. 8 is an explanatory view showing an outline of the Monte Carlo simulation.

When a solid sample is irradiated with an electron beam, the electron enters the solid sample while being scattered. During simulation of a track of the electron, the Monte Carlo (MC) technique is often used. A simulation model of the technique is disclosed in Document 1. There will hereinafter briefly be described a calculation model of the electron track in a thin film sample with reference to FIG. 8.

The electron enters point $P_0$ on the surface of the thin film sample, is elastically scattered at points $P_1$, $P_2$ and $P_3$ to change its travel direction, and is finally transmitted as a transmission electron from a point $P_4$ on the back surface. During each elastic scattering, a scattering angle $\phi$ is calculated using a differential scattering sectional area $d\sigma(\phi)$ calculated using a screen coulomb potential, and a first random number (uniform random number generated from a region 0-1) $R_1$.

$$R_1 = \frac{\int_0^\phi (2\pi \cdot \sin\phi) \cdot d\sigma(\phi)d\phi}{\sigma_T} \quad \text{(Equation 2)}$$

$$\sigma_T = \int_0^\pi (2\pi \cdot \sin\phi) \cdot d\sigma(\phi) \quad \text{(Equation 3)}$$

wherein $\sigma_T$ is a total scattering sectional area. A rotation angle $\psi$ of the scattered electron in the travel direction is determined using a second uniform random number separately generated.

$$\psi = 2\pi \cdot R_2 \quad \text{(Equation 4)}$$

A path length L until the next elastic scattering is determined using a third uniform random number $R_3$ and an average free path $\lambda$.

$$L = -\lambda \cdot \log_e(R_3) \quad \text{(Equation 5)}$$

$$\lambda = A/(N_a \cdot \rho \cdot \sigma_T) \quad \text{(Equation 6)}$$

wherein $N_a$ is the Avogadro constant, $\rho$ is a density of the sample, and $\sigma_T$ is the total scattering sectional area. Moreover, while the electron travels along this path length L, the electron loses kinetic energy owing to non-elastic collision. A loss ability of the energy can be calculated from an extended version of the Bethe equation. The area $\sigma_T$ has a characteristic that it enlarges, when an atomic number Z2 of the sample is large, or kinetic energy E of a collision electron is small. The above equation was used in specific calculations of $d\sigma(\phi)$ and $\sigma_T$.

Thus, when the electron passes through the sample from the back surface, returns to the surface and escapes from the surface, or when the energy drops until the electron stops in the sample, energy loss due to the elastic scattering, forward travel along the path length and non-elastic scattering is repeated to perform the calculation. This is an MC model based on single scattering. When the number of incident electrons is increased, it is possible to extract a characteristic of an average behavior of the electron.

During calculation of a contrast of the present STEM image, with respect to a vertically incident electron, there was calculated a distribution $F(\theta)$ of a scattering angle $\theta$ from an optical axis Z as a depth direction of the transmission electron. Assuming that a transmission electron intensity per unit solid angle of the scattering angle $\theta$ with respect to a Z-axis of the transmission electron is $P(\theta)$, there is a relation between $P(\theta)$ and $F(\theta)$ as represented by the following equation.

$$F(\theta) = 2\pi \cdot \sin(\theta) \cdot P(\theta) \quad \text{(Equation 7)}$$

Assuming that a range of a detected scattering angle of the transmission electron in an annular DF detector is a range of $\theta_1$ to $\theta_2$, a detection intensity $I(\theta_1, \theta_2)$ of the transmission electron can be calculated from the following equation.

$$I(\theta_1,\theta_2) = \int_{\theta_1}^{\theta_2} F(\theta)d\theta \quad \text{(Equation 8)}$$

However, it is assumed that sample constituting element information is known, and a substance having an average atomic number weighted by an atom concentration is presumed with respect to a composite material to perform MC calculation. When higher-precision calculation is necessary, there is used a probability obtained by weighting collision with atoms of individual constituting elements in the composite material by a product of the total sectional area and the atom concentration without being averaged to perform the MC calculation.

Next, there will be described an example of simulation using an actual sample.

Figure 9A:
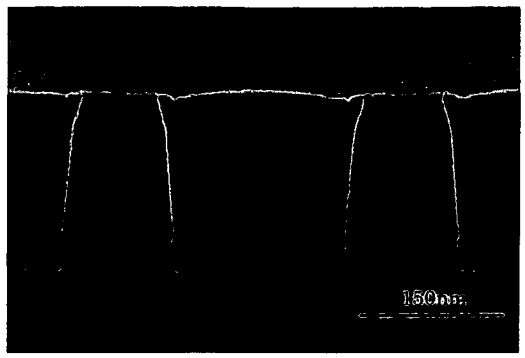
FIGS. 9A-9D are explanatory views showing examples of the dark-field image and the bright-field image of a copper wiring line.
Figure 9B:
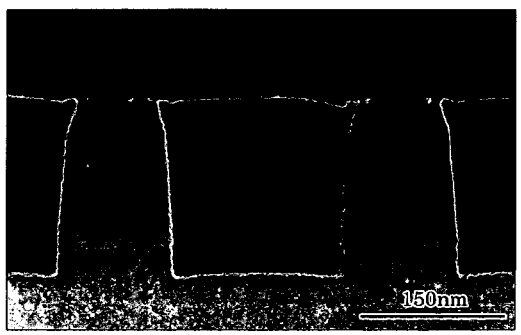
Figure 9C:
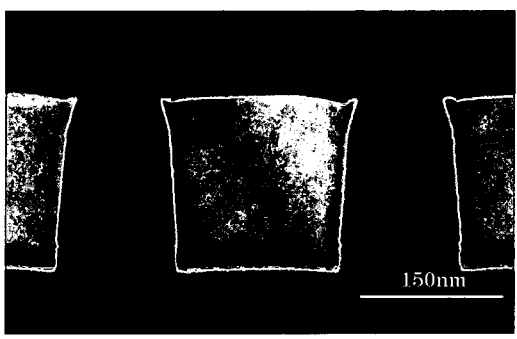
Figure 9D:
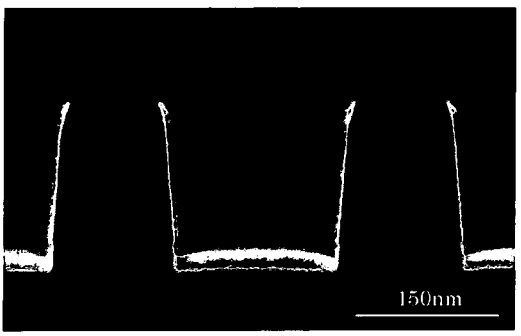

FIGS. 9A to 9D show examples of a bright-field image and dark-field images obtained by photographing a section (thickness is about 100 nm) of a copper wiring line with an STEM (acceleration voltage of 30 KV). FIG. 9A shows the bright-field image acquired as a reference image, and FIGS. 9B to 9D show dark-field images obtained at a time when detected angle regions are changed, respectively. Element types constituting the copper wiring line are constituted of three types of Cu of a wiring line portion; Ta of a barrier metal portion; and $SiO_2$ with which a periphery is filled. Among three types of dark-field image diagrams FIGS. 9B to 9D, the diagram having a contrast (atomic number contrast OK) in which the atomic number is reflected is FIG. 9D in which Ta as the heaviest element is displayed most brightly.

Conversely, in FIGS. 9B and 9C, although the same field is observed, any atomic number is not reflected in the contrast (atomic number contrast NG).

Figure 10:
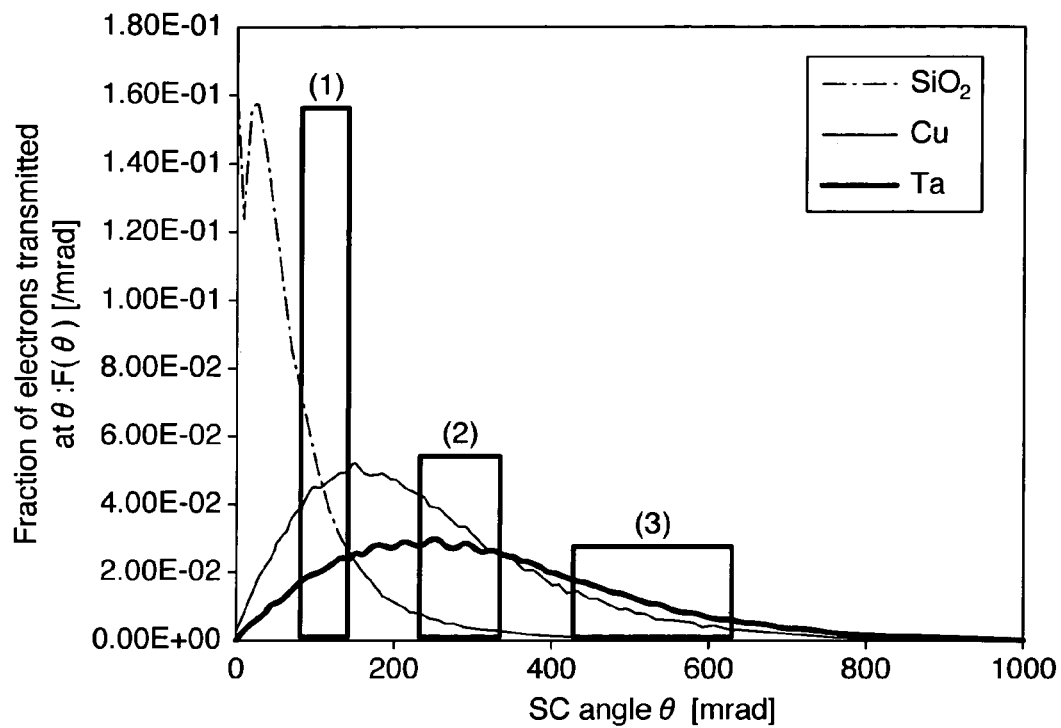
FIG. 10 is an explanatory view showing one example of a simulation result of scattering of an transmission electron.

FIG. 10 shows results of calculation by a simulation program with respect to each constituting element in a scattering angle region in a case where an electron having energy of 30 keV passes through this copper wiring line having a thickness of 100 nm. In FIG. 10, the simulation results of the constituting elements are arranged, the ordinate indicates a signal intensity per unit solid angle of the scattering angle, and the abscissa indicates the scattering angle region. In the drawing, selected regions (1), (2) and (3) indicate scattering angle regions detected during the photographing of the dark-field image diagrams FIGS. 9B, 9C and 9D.

Figure 11:
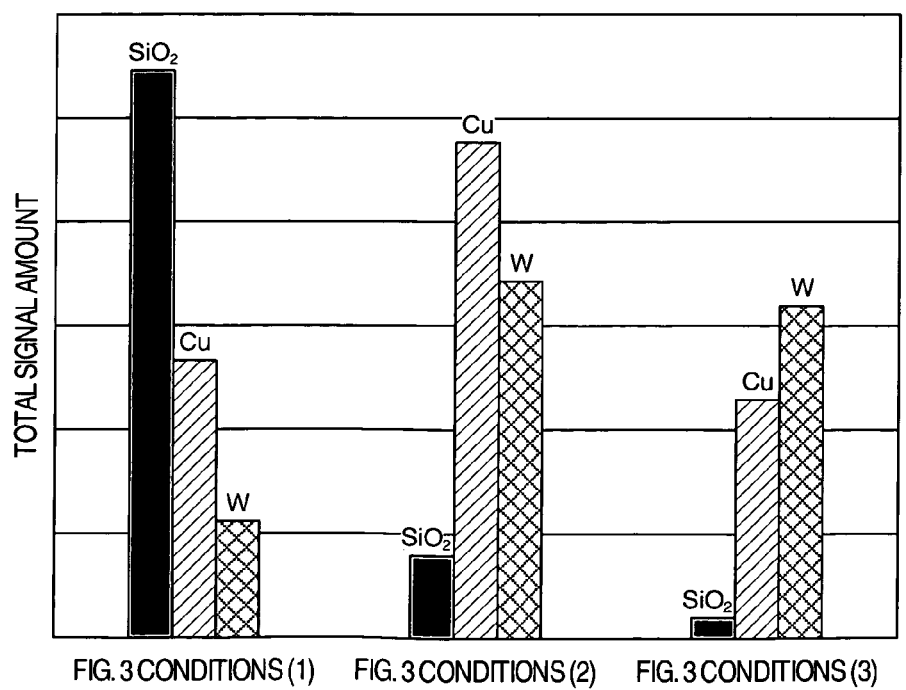
FIG. 11 is an explanatory view of comparison among total signal amounts of regions (1), (2) and (3)

Next, there will be described a relation between the resultant simulation result and a dark-field image contrast. The contrasts of the dark-field images of FIGS. 9B to 9D can be seen from total signal amounts detected in the corresponding scattering angle regions. In FIG. 11, the total signal amounts detected in the detection regions (1), (2) and (3) are calculated by Equation 8, and relative intensities of the signals for the constituting elements are compared with each other.

In the detection region (1), a detection amount of the electron transmitted through $SiO_2$ (average atomic number: 10) is largest, and then a signal amount decreases in order from Cu to Ta. The dark-field image of FIG. 9B corresponding to this detection region (1) has such a contrast that $SiO_2$ is brightest, and then Cu and Ta are darkened in order. FIGS. 9C and 9D similarly show dark-field STEM images in which the total signal amounts of the elements obtained in the detection regions are reflected. This reveals that the larger the total signal amount of each element is, the brighter the contrast becomes. The smaller the amount is, the darker the contrast becomes. Such a contrast is reflected in the image.

The bright-field STEM image in a range of small scattering angles (e.g., a range of zero to 10 mrad) has a characteristic that the total amount of the detected signals becomes large as an atomic number Z of the sample element becomes small. In a case where a dependence of the bright-field STEM image on the Z-contrast is compared with that of the dark-field image on the Z-contrast, when the same dependence on the Z-contrast is qualitatively indicated, it will be described hereinafter that there is a "positive correlation" between both the images. On the other hand, when Z of the dark-field image is reduced, the total amount of the detected signals increases, and there is a tendency reverse to that of the dependence of the bright-field image on the Z-contrast, it will be described hereinafter that there is a "negative correlation" between both the images.

To obtain the dark-field image having the negative correlation with the bright-field image, that is, to obtain a bright contrast in order from a high Z, when Z of the dark-field image as a valuation object is large, a detected angle region where the total amount of the signals is large may be selected.

Since in this copper wiring line sample, the average atomic number order is Ta (73)>Cu (29)>$SiO_2$ (10), conditions may be set on which the scattering angle region (3) is detected where the total amount of the signals has an order of Ta>Cu>$SiO_2$.

At this time, as an example of the selection of the scattering angle region, the example has been described in which the detected angle regions are limited to (1), (2) and (3), but the scattering angle region where the total amount of the signals has an order of Ta>Cu>$SiO_2$ is not limited to (3). To select an optimum region from a plurality of regions for obtaining the atomic number contrast, a region where the contrast is highest and the total amount of the signals is large (i.e., the S/N ratio is enhanced) may be selected from the corresponding conditions. Now assuming that the total amounts of the signals of elements A and B are Ia and Ib (with the proviso that Ia≧Ib), contrast C is usually defined by the following equation.

$$C=2(Ia-Ib)/(Ia+Ib) \quad \text{(Equation 9)}$$

However, since the image indicates a considerable total amount of the signals as an image intensity of the signal, the image contrast is convenient for discussion of a magnitude of a difference (Ia−Ib) between the total amounts of the signals. This will hereinafter apply. There will be described hereinafter conditions for acquiring an image having a high contrast. When a sample is constituted of a large number of elements (A, B, C, etc.), the contrast between the elements A and B is maximized, and then there must be a case where the contrast between the elements B and C is not maximized. If any specially noted element is not specified, it may be set to take the following technique as a default.

For example, as a result of comparison of differences (A−B, B−C, C−D and D−E) between adjacent atomic numbers of the sample (observation field) constituted of A, B, C, D and E (the average atomic number has a relation of A>B>C>D>E), when the atomic number difference of A−B is maximum, conditions on which the difference A−B of the total amount of the signals is maximized is selected from atomic number contrast acquiring conditions (conditions on which the total amount of the signals has a relation of A>B>C>D>E) obtained by the simulation. That is, it is assumed that two elements having the maximum atomic number difference are references, and conditions are selected on which the contrast between the two elements is most remarkably reflected. However, when a sample constituting substance is a composite material, a substance having the average atomic number weighted by the atom concentration is presumed for the comparison.

Moreover, when there is an element difference to be especially noted, the element difference is designated, and conditions are selected on which the contrast between both the elements is emphasized (=the difference of the detected signal amount is maximized). This will be described later in detail.

Here, as an example of a sample constituted of a heavy element mixed with several types of light elements, an SRAM will be described.

Figure 12A:
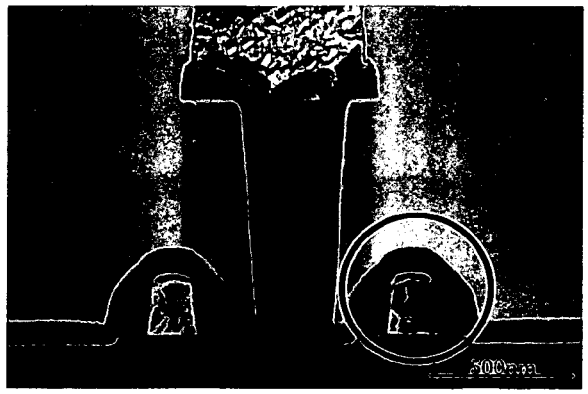
FIGS. 12A-12C are explanatory views showing examples of the bright-field image and the dark-field image of an SRAM.
Figure 12B:
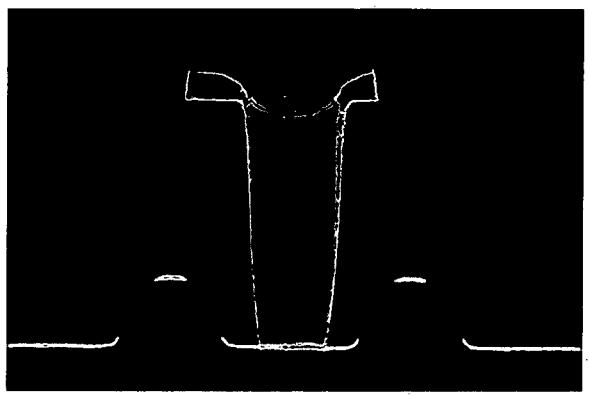
Figure 12C:
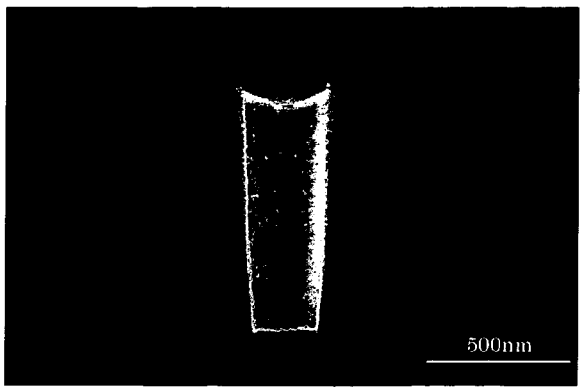

The sample (SRAM) shown in FIGS. 12A to 12C is constituted of W, CoSix, PolySi, $SiO_2$, SiN and the like, and W is an excessively heavy element among them. To obtain a contrast which reflects the atomic number with respect to all the elements including W, a large scattering angle region needs to be detected. However, in this case, a contrast in an MOS transistor gate portion (circled portion) drops owing to S/N shortage.

Therefore, to note the contrast of these light elements, a comparatively small scattering angle region needs to be detected. In this case, the element types for use in the simulation are limited to the only noted light elements excluding W or the like. Accordingly, the atomic number contrast can be obtained with respect to the targeted element type. In this case, the elements to be noted are designated, or only unnecessary elements may be excluded.

To obtain the contrast in which the atomic number is reflected with respect to a plurality of element types to be especially noted in the sample in this manner, calculation is not performed with respect to all of the sample constituting elements, and the calculation can be limited to the only elements to be noted (however, in this case, it is impossible to judge an image quality by comparison with the bright-field image, and to avoid this, attention may be paid so that the only elements to be noted are included in the image).

Moreover, in the present simulation, as sample information, the thickness of the sample needs to be input in addition to the sample constituting elements, but even in a case where this input value is largely different from a value of the actual sample, the conditions largely differ from ideal observing conditions. As a result, a sample damage or contamination and a drop of operation efficiency are caused. Especially when an unknown sample is observed, or sample information is vague, there is a high possibility that errors are generated. As means for preventing this, the following technique and the like are used together.

The thickness of the thin film sample is measured correctly beforehand (the thin film sample is observed in a sectional direction with an SEM or the like), and the actually measured sample thickness is input (or automatically reflected) in the simulation, so that generation of a large error can be prevented.

In addition, if there is a technique (EDX analysis or the like) capable of defining the constituting elements in the device before the observation, the constituting elements of the sample are specified in advance, and the calculation is performed using the element types, whereby it is possible to prevent the generation of the large error in advance.

In a case where these techniques are combined, even when the sample information is vague or is not known at all, it is possible to acquire the image more correctly while the number of the photographed images is minimized (the damage or the contamination on the sample is suppressed).

Figure 13:
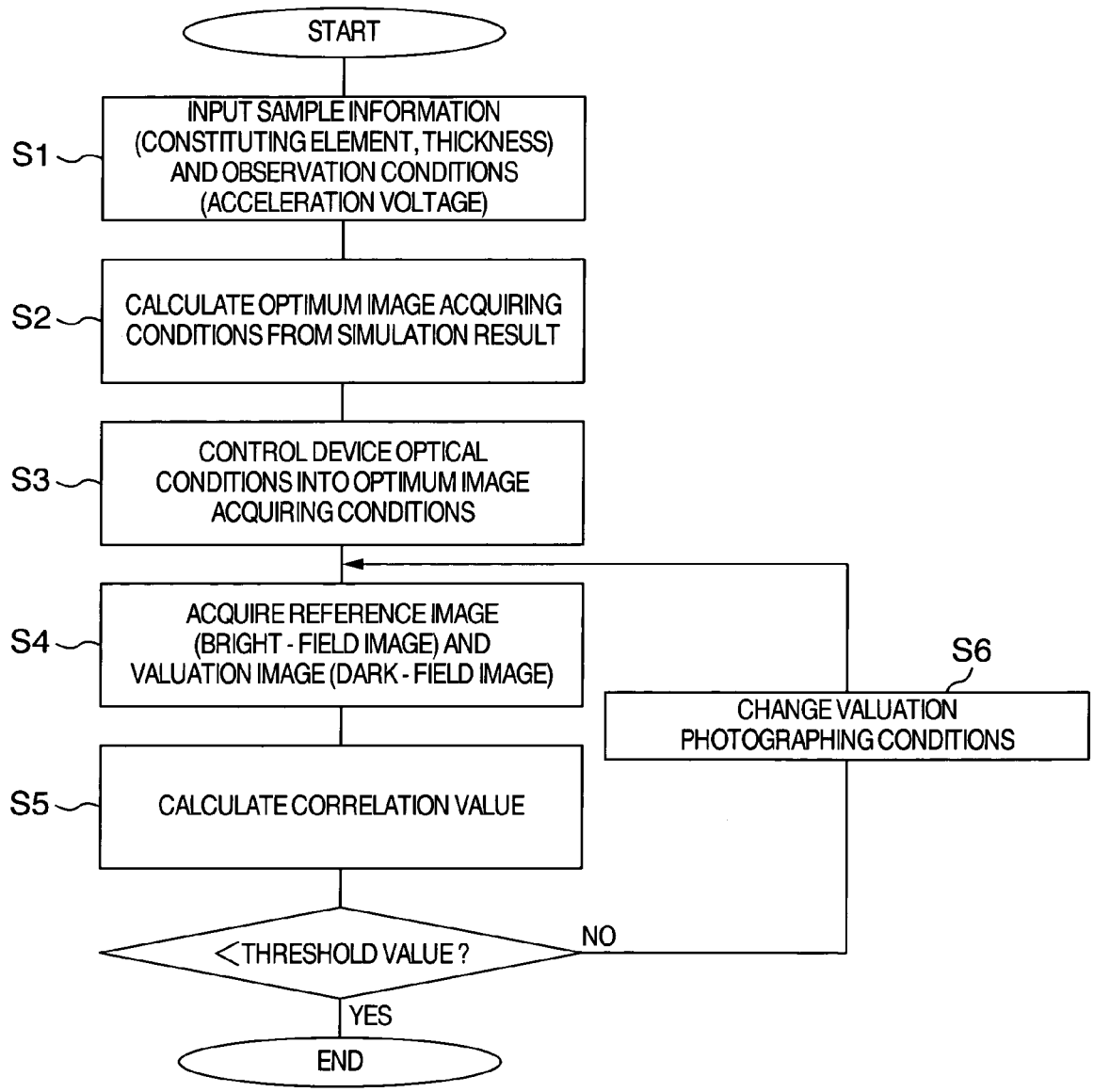
FIG. 13 is an explanatory view of a series of flows until the images are acquired.

FIG. 13 shows a processing flow at a time when a technique for deriving the atomic number contrast image acquiring conditions using the above simulation is combined with a contrast judgment mechanism described in Embodiment 1. First, a numeric value for use in the simulation is input (step 1). Here, information to be input includes at least three items 1) constituting elements of a valuation sample; 2) a sample thickness; and 3) an acceleration voltage value of an electron beam for use in the observation. From a result of the simulation performed using the input value, theoretically optimum observing conditions are derived with respect to the valuation sample (step 2), and the device is controlled so as to obtain the observing conditions (step 3). At this time, between the steps 2 and 3, the derived observing conditions are once displayed in a screen, and it may be selected whether or not the observation on the conditions is permitted, or the flow may automatically be advanced. It is preferable that either setting can be made.

After completing the change of the device conditions, a reference image and a valuation image are acquired (step 4). At this time, if a focus, astigmatism, brightness, contrast or the like of each image is adjusted before start of the flow, a procedure until the images are acquired can be automated, but it is preferable to temporarily stop the flow immediately before the step 4 so that the adjustment can be performed again. In a case where the device is provided with functions (auto focus, auto stigma, auto brightness contrast control, etc.) capable of automatically controlling the adjustment, when these functions are also used, further automation is possible. The applications of these functions may arbitrarily be set.

It is assumed that contents of calculation (step 5) of correlation values of the obtained images and judgment (step 6) of an image contrast from the correlation values are the same as those described in Embodiment 1.

When the correlation value is below the set threshold value in the step 6, it can be judged that the atomic number contrast is obtained, and therefore the flow ends. Conversely, when the correlation value is above the threshold value, the steps 4 to 6 are repeated while changing the observing conditions until the correlation value drops below the threshold value.

Here, there will be described a technique to adjust optical conditions in a case where the calculated correlation value is above the threshold value. When the correlation value is above the threshold value (=the atomic number contrast cannot be acquired), the following causes are considered.

(Case 1) There is detected a scattering region having a remarkably small angle as compared with the optimum scattering detection angle region.

(Case 2) There is detected a scattering region having a remarkably large angle as compared with the optimum scattering detection angle region.

In Case 1, a part or all of the resultant dark-field image indicates a contrast equal to that of the bright-field image. Therefore, there may be imparted a mechanism to detect whether or not the image includes information (contrast) of the bright-field image, and optical conditions may be adjusted so as to detect a larger scattering angle region if any. Moreover, there may be set beforehand a degree of shift of the detection region to a large angle side in a case where bright-field information is detected, and the optical conditions may automatically be adjusted. As the mechanism to detect the information of the bright-field image, line scanning of the valuation image (dark-field image) and the reference image (bright-field image) is performed. When both waveform patterns agree with each other or are similar to each other, it can be judged that the information of the bright-field image is included. It is preferable that a place to be line-scanned and the number of scanning times can manually or automatically be set.

Here, the reference image may be a BSE image. In this case, when the waveform pattern of the reference image agrees with or is similar to that of the valuation image, it can be judged that the reference image has the atomic number contrast. Moreover, the image contrast may be judged from a correlation between the images.

In Case 2, since the resultant dark-field image has a large S/N shortage, the obtained image is dark and has a low contrast. Therefore, when such an image is obtained, the optical conditions may be adjusted so as to detect a smaller scattering angle region. This region can be detected by a mechanism to judge a low S/N in a case where a signal intensity of the whole image is below a defined value, or the signal intensity is not obtained or is weak even in a portion of the bright-field image in which a contrast (signal intensity) difference is obtained at a time when the valuation image (dark-field image) and the reference image (bright-field image) are line-scanned. Even in this case, it is preferable that the place to be line-scanned and the number of the scanning times can manually or automatically be set.

Figure 14:
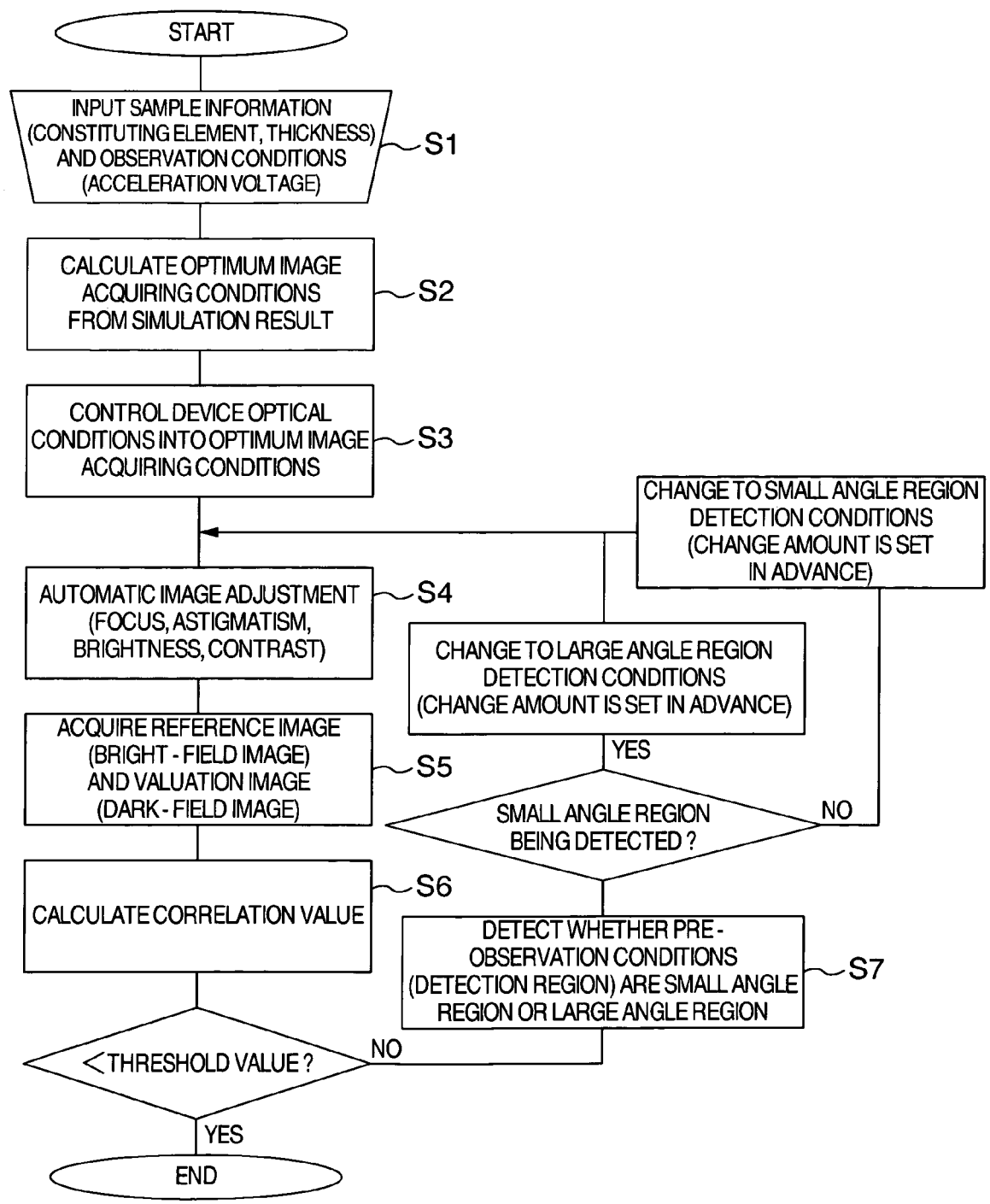
FIG. 14 is an explanatory view of a series of flows until the images are acquired, which are preferable for automation.

Considering that all the above-described techniques be utilized and automated if possible, the only sample information and observation conditions for use in the simulation can be input to complete the acquisition of the target image. FIG. 14 is a flow chart at a time when a procedure until the image is acquired is automated as much as possible. The only input of the sample information and observation conditions (step 1) needs to be manually performed, and another processing is all automated. As described above, steps 4 to 7 are repeated until the dark-field STEM image having the atomic number contrast is obtained.

The present embodiment is especially effective in the electron beam device having display means for accelerating the electron beam at 100 kV or less and displaying the dark-field image and the bright-field image.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A charged particle beam device comprising:
a charged particle source; and
an optical charged particle system which focuses a charged particle beam emitted from the charged particle source to scan the charged particle beam on a sample,
the device further comprising:
a control unit which forms a bright-field image or a back-scattered electron image and a dark-field image based on a transmission electron scattered in the sample or an electron scattered back from the sample,
wherein the control unit compares the bright-field image or the back-scattered electron image with the dark-field image to calculate a correlation between the bright-field image or the back-scattered electron image and the dark-field image.

2. The charged particle beam device according to claim 1, wherein the control unit judges whether or not a correlation value between the bright-field image or the back-scattered electron image and the dark-field image is below a threshold value.

3. The charged particle beam device according to claim 2, wherein the control unit judges that the dark-field image is appropriate, in a case where the correlation value is below the threshold value.

4. The charged particle beam device according to claim 2, wherein the control unit judges that the dark-field image is inappropriate, in a case where the correlation value is above the threshold value.

5. A computer program product for use in a control unit which receives a signal based on a transmission electron and/or a back-scattered electron detected by a charged particle beam device to form a bright-field image or a back-scattered electron image and a dark-field image of a sample, the computer program product comprising:
a sequence to compare the bright-field image or the back-scattered electron image with the dark-field image to calculate a correlation between the images.

6. A sample image forming method which scans a charged particle beam on a sample to form a bright-field image or a back-scattered electron image and a dark-field image of the sample based on an electron transmitted through the sample, the method comprising the steps of:
comparing the formed bright-field image or the back-scattered electron image with the dark-field image to calculate a correlation between the images; and
adjusting optical conditions of the charged particle beam, in a case where the calculated correlation value is above a threshold value.

7. A charged particle beam device comprising:
a charged particle source; and
an optical charged particle system which focuses a charged particle beam emitted from the charged particle source to scan the charged particle beam on a sample,
the device further comprising:
a control unit which forms a dark-field image based on a transmission electron scattered in the sample,
wherein the control unit compares reference information registered in the control unit with the dark-field image to judge whether or not the dark-field image has a predetermined contrast.

8. The charged particle beam device according to claim 7, wherein the reference information is a bright-field image formed by detecting the electron transmitted through the sample, a back-scattered electron image formed by detecting a back-scattered electron scattered back from the sample, or sample information input by an input unit which inputs information into the control unit.

9. The charged particle beam device according to claim 7, wherein the control unit compares the dark-field image with the reference information to judge whether or not the dark-field image has the predetermined contrast with respect to the reference information.

10. A charged particle beam device comprising:
a charged particle source; and
an optical charged particle system which focuses a charged particle beam emitted from the charged particle source to scan the charged particle beam on a sample,
the device further comprising:
a control unit which forms a dark-field image based on a transmission electron scattered in the sample or an electron scattered back from the sample,
wherein the control unit stores a scattering simulation result of the transmission electron.

11. The charged particle beam device according to claim 10, wherein the control unit adjusts acquisition conditions of a dark-field signal based on the scattering simulation result.

12. The charged particle beam device according to claim 10, wherein the control unit estimates a scattering angle of the electron transmitted through constituting elements in a depth direction and a transmission electron intensity per unit solid angle of the scattering angle based on the constituting elements of the sample and device conditions.

13. The charged particle beam device according to claim 10, wherein the control unit compares signal intensities of the constituting elements with each other to thereby predict a contrast of the dark-field image.

* * * * *